MEANS FOR NEUTRALIZING AMPLIFIER CIRCUITS
Filed March 20, 1961
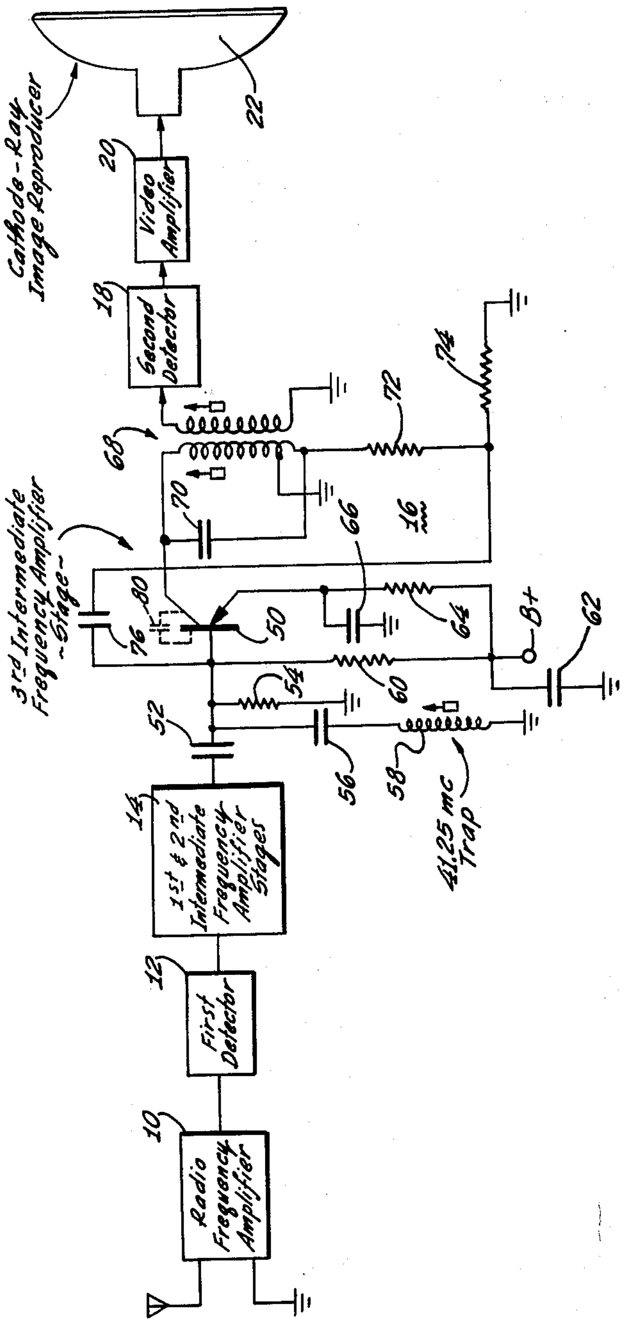
INVENTOR:
Gerald L. Caprio
By Mueller & Aichele
Attorneys United States Patent Office 3,157,840
Patented Nov. 17, 1964

3,157,840
MEANS FOR NEUTRALIZING AMPLIFIER CIRCUITS

Gerald L. Caprio, Carpentersville, Ill., assignor to Motorola, Inc., Chicago, Ill., a corporation of Illinois Filed Mar. 20, 1961, Ser. No. 97,096
2 Claims. (Cl. 330—27)

The present invention relates to neutralizing circuits, and it relates more particularly to an improved neutralizing circuit for use in a transistorized amplifier for neutralizing the effects of inter-electrode capacity in the transistor included in the amplifier.

The need for neutralization in transistorized high frequency amplifiers is usually much greater than in corresponding vacuum tube circuits. In multi-stage unneutralized, tuned transistor amplifiers, it has been found that inter-stage tuning interaction, for example, tends to be so severe that synchronous tuning often cannot be attained. Furthermore, it is generally possible to cause an unneutralized transistor amplifier stage to oscillate with slight mistuning. The possibility of oscillation exists because of the negative input resistance which can be produced by the feedback.

The present invention will be described herein as incorporated into the final intermediate frequency transistor amplifier stage of a television receiver. However, it will become evident as the description proceeds that the invention has general application in the neutralization of transistor or other types of amplifier stages.

In general, neutralization is required in transistorized amplifiers at any frequency where the collector capacitance influences the gain of the amplifier. Various circuits for neutralizing high frequency transistor amplifiers are known. It is usual for such circuits to include either a tapped single coil in the output transformer of the amplifier, or a separate winding, as a source of the neutralizing signal. In either instance, a feedback capacitor is usually coupled to the tapped coil or separate output winding for feeding the neutralizing signal back to the input circuit.

In a usual common emitter transistor amplifier, the collector-base inter-electrode capacitance of the transistor included therein has a tendency to introduce unwanted feedback signals into the input circuit. This tendency, as noted above, becomes more pronounced at the relatively high frequencies where regenerative feedback can cause instability and/or degenerative feedback can cause gain reduction. The unwanted feedback signals are usually neutralized in the prior art amplifiers in the manner mentioned briefly above.

However, due to the relatively wide variation in the collector-base internal capacitance from transistor to transistor in the present state of transistor development, the prior art neutralizing circuits usually require that the neutralizing or feedback capacitor be variable, or be shunted by a variable trimmer capacitor, so that each of a plurality of amplifier units may be tuned to an optimum neutralized condition. However, the use of such variable capacitor represents increased unit cost as compared to amplifiers using only fixed neutralizing capacitors.

It is, accordingly, an object of the present invention to provide an improved neutralizing circuit for incorporation in an amplifier and in which the requirement for a variable neutralizing capacitor is obviated.

Another object of the invention is to provide more uniform gain in a transistor amplifier circuit, even though the transistors in different ones of the amplifiers may exhibit a relatively wide variation in inter-electrode capacitance.

Yet another object of the invention is to provide such an improved neutralizing circuit which may substantially reduce the effect of variation of interelectrode capacitance among transistors used in a plurality of different transistor amplifiers.

In the prior art neutralizing circuits of the type mentioned above, the effect of an improper value of the series neutralizing capacitor as compared to a given interelectrode capacitance, in addition to producing variations in gain by not cancelling the proper amount of negative feedback through the interelectrode capacitance, erratically alters the input and output impedances of the transistor as a correlative to improper neutralization. This is due to a snowballing effect in the amplifier which arises because, when the value of the neutralizing capacitor is too small, for example, the input impedance of the amplifier becomes lower due to unneutralized degenerative feedback through the internal capacitance, as does the output impedance, but not in the same ratio; and when the input impedance becomes lower, there is more attenuation of the external feedback and the input impedance becomes lower yet. Likewise, when the value of the neutralizing capacitor is too large, the input impedance becomes larger and there is less attenuation of the feedback signal, so that the input impedance becomes effectively larger yet.

A feature of the present invention is the provision of a neutralizing circuit in which the neutralizing feedback signal is derived from a relatively low impedance source so that the snowballing condition discussed above is virtually eliminated and the aforementioned variation in impedances is reduced significantly.

Another feature of the invention is the provision of a transistor neutralizing circuit in which regenerative feedback for neutralizing gain reducing degeneration in the amplifier is derived from a resistive divider connected across a small portion of an output inductance of the amplifier.

The above and other features of the invention which are believed to be new are set forth with particularity in the claims. The invention itself, however, together with further objects and advantages thereof, may best be understood from a consideration of the following description in conjunction with the accompanying drawings. The single figure in the drawing illustrates, partially in block form and partially in circuitry, a portion of a television receiver. It should be pointed out, that the audio and sweep sections of the television receiver form no part of the present invention, and, for that reason, have not been shown in the figure.

The television receiver of the single figure may include a usual radio frequency amplifier 10 of one or more stages. The radio frequency amplifier includes usual input circuitry which is connected to a suitable antenna and to ground. The output signal from the radio frequency amplifier 10 is coupled to a first detector 12. The first detector includes a usual mixer and heterodyne oscillator stage, and it serves to heterodyne the received radio frequency signal to an intermediate frequency signal of a selected intermediate frequency.

The resulting intermediate frequency signal is coupled to an intermediate frequency amplifier which, as illustrated, is made up of three stages. The first two stages of the intermediate frequency amplifier are represented by the block 14, and the third stage 16 of the intermediate frequency amplifier is composed of circuitry which will be described in more detail subsequently. The output from the final intermediate frequency amplifier stage 16 is applied to a usual second detector 18, and the resulting video signal from the detector 18 is amplified by a video amplifier 20 and applied to a cathode ray image reproducer 22.

The general operation of the television receiver described briefly above is believed to be well known, so that a further description thereof is deemed to be unnecessary.

The circuitry of the final intermediate frequency amplifier stage 16 includes a transistor 50. This transistor, as illustrated, may be a PNP transistor.

The output signal from the intermediate frequency amplifier stage 14 is applied through a coupling capacitor 52 to the base electrode of the transistor 50. This base electrode is direct current biased by a potential existing at the junction of resistors 54 and 60. These resistors are series connected between ground and B+. Capacitor 56 and inductor 58 are series connected from the base electrode to ground and these two elements form a series tuned trap resonant at 41.25 megacycles in order to attenuate the sound intermediate frequency. It will be understood that in the stage 16 as contemplated in the specific circuit being described herein, the intermediate frequency of the video carrier will be at a frequency of 45.75 megacycles. It is contemplated also that the B+ potential may be of the order of 13 volts. The capacitor 62 represents generally a bypass for radio frequency signals.

The emitter electrode of the transistor 50 is connected through a bias resistor 64 to B+ and the emitter electrode is bypassed for signal frequencies by means of capacitor 66. Thus, the circuit operates as a grounded emitter amplifier. The collector electrode of transistor 50 is connected to the primary winding of an output coupling transformer 68 having tuned primary and secondary windings. A capacitor 70 is connected across the primary winding of transformer 68 in order to provide capacitance for the proper tuning of this winding. A tap of the primary winding of transformer 68 is connected to ground to complete the direct current path to the collector of the transistor 50. The secondary winding of transformer 68 is also tuned and is connected to the second detector 18.

The resistors 72 and 74 are connected in series between the bottom terminal of the primary winding of transformer 68 and the grounded tap thereof. A neutralizing capacitor 76 is connected between the junction of resistors 72, 74 and the base electrode of transistor 50.

For purposes of better understanding the invention the capacitance 80 is shown between the collector and base electrodes of the transistor 50. It will be understood that this capacitance represents an internal interelectrode capacitance within the transistor which actually exists between the collector and base electrodes internally and is not, in fact, actually fully equivalent to a capacitor connected externally between these electrodes. As previously indicated, it is common that the capacity represented by the capacitance 80 introduce degenerative or negative feedback into the system in the desired bandpass of signals such that the gain of the amplifier 16 is undesirably reduced. Therefore, an offsetting regenerative signal is obtained between the grounded tap of the primary winding of transformer 68 and the lower end of this winding, and this signal is fed back through capacitor 76 for neutralization of the degenerative signal thereby raising the effective gain of the amplifier. However, it has also been pointed out that in a system of this type which is practical for mass production, the effective value of the internal collector-to-base capacitance may vary considerably among different transistors of the same type. This means that by the use of a fixed capacitor in the position of capacitor 76, the value thereof would not be optimum for all of the different internal capacitances of the transistors which would be encountered.

When the value of the capacitor 76 is not properly related to the effective value of the capacitance 80, there is a variation in gain of the amplifier 16 because more or less than the optimum amount of the degenerative feedback caused by capacitance 80 will be neutralized by the signal fed back through capacitor 76. However, as part of the cause of the variation in gain there is an undesirable alteration in the input and output impedances of the transistor 50. This change in the input and output impedances tends to further aggravate the condition of the improper value of capacitor 76 for the particular transistor used in the amplifier. That is, if the value of a neutralizing capacitor 76 is too small, it will not apply a sufficient neutralizing signal to the base of the transistor 50, a net excessive degenerative condition will exist because of the internal capacitance 80. In this situation the input impedance of the transistor 50 is lower and the output impedance is lower also. With the output impedance lower, less of a signal is fed back through capacitor 76, and with the input impedance lower, less of the neutralizing signal is developed across this reduced input impedance. The exact converse situation occurs if the value of the neutralizing capacitor 76 is too large for the effective interelectrode capacitance 80 of a given transistor. In the present system the feedback neutralizing signal is developed in such a way that the source thereof for the neutralizing capacitor 76 is of very low impedance. Therefore, variations of input and output impedance due to an improper value of the capacitor 76 will have very little effect on the size of the neutralizing signal and the overall adverse effects of the mismatch of the capacitor 76 with respect to the effective value of capacitance 80 can be substantially overcome.

It should be recognized that the primary winding of transformer 68 may have a relatively small number of turns in view of the necessary tuning thereof and the desirable bandpass characteristics to be established in the overall amplifier. For example, the upper portion of the primary winding of the transformer 68 may have about 8 turns. In this situation the grounded tap thereof may be one turn from the end so that the overall coil has a total of 9 turns. With the grounded tap at such a point of a primary winding of this construction, it can be impractical to further reduce the impedance of the lower portion of the winding between the tap and the bottom terminal of this winding by selecting less than a full turn as the connection position for the tap. Thus, from the standpoint of practical commercial construction of the primary winding of the transformer 68, the impedance of the feedback or neutralizing portion of the winding, that is from the tap to the lower end thereof, may be substantially higher than that necessary to overcome the above-described adverse effect on gain variation in the amplifier with different transistors having different inter-electrode capacitances.

This problem is overcome by selecting resistor 72 to have a relatively large value compared to the value of resistor 74, but still compatible with a practical value for the neutralizing capacitor 76, so that the effective source impedance for the neutralizing or feedback signal is made very small. Then, as previously explained, the variations of input and output impedance due to a mismatching of a capacitance 80 with the capacitor 76 will be substantially overcome.

It should be noted that the total resistance of the resistors 72 and 74 as connected across the lower portion of the primary winding of the transformer 68 may be relatively large so that the transformer winding is not unduly loaded. It should also be pointed out that with the resistive divider utilized to reduce the source impedance for the feedback neutralizing signal, there will be lesser tendency to have an undesirable phase shift of the neutralizing signal as fed back.

In a system of practical construction the component values were as follows:

| | |
|---|---|
| Capacitor **52** | .001 microfarad. |
| Tranistor **50** | 4501 or 4509 (Motorola). |
| Resistor **54** | 2,700 ohms. |
| Resistor **60** | 1,000 ohms. |
| Capacitor **62** | .05 microfarad. |
| Resistor **64** | 1,200 ohms. |
| Capacitor **66** | .005 microfarad. |

| | |
|---|---|
| Transformer 68 primary winding | 9 turns, No. 28 DCC wire close wound on a ¾ inch form and tapped at one turn. |
| Capacitor 70 | 15 micromicrofarads. |
| Resistor 72 | 220 ohms. |
| Resistor 74 | 18 ohms. |
| Capacitor 76 | 68 micromicrofarads. |

The invention provides, therefore, an improved and simple neutralizing circuit which is so conceived that variations in inter-electrode capacitance in different transistors in a common emitter circuit have greatly reduced effect on the input and output impedances of such amplifiers, and thus amplifier gain is rendered more uniform despite transistor variations. The neutralizing circuit of the invention is most advantageous, in that it permits a fixed neutralizing capacitance to be used, and thereby obviates the expense and adjustments required when variable neutralizing capacitors are incorporated in the system.

What is claimed is:

1. An amplifier including a transistor having a base electrode and an emitter electrode and a collector electrode, an input circuit coupled to said base and emitter electrodes, an output circuit coupled to said collector and emitter electrodes, said transistor exhibiting collector-base interelectrode capacity having a tendency to feed back an unwanted signal to said input circuit, an inductance coil included in said output circuit and having a neutralizing winding across which a neutralizing signal is developed, first and second resistors series connected across said neutralizing winding, means connecting one side of said first resistor to a reference point, said first resistor having substantially less resistance than said second resistor and providing the neutralizing signal thereacross, a capacitor connected between the other side of said first resistor and said base electrode for feeding back the neutralizing signal to neutralize the unwanted signal, whereby said first resistor forms a source impedance for the neutralizing signal which is less than the impedance of said neutralizing winding.

2. An amplifier for high frequency signals, including in combination, a transistor having a base electrode and an emitter electrode and a collector electrode, an input circuit coupled to said base and emitter electrodes, a tuned output circuit coupled to said collector and emitter electrodes, said transistor exhibiting collector-base interelectrode capacity having a tendency to feed back an unwanted signal to said input circuit, an inductance coil included in said output circuit and having a neutralizing winding across which a neutralizing signal is developed, said neutralizing winding having an impedance of high enough value so that as a source of neutralizing signals for the unwanted signal the impedance thereof causes an undesired variation of input and output impedance of said transistor with transistors having different values of said interelectrode capacity, first and second resistors series connected across said neutralizing winding, means connecting one side of said first resistor to a reference point, said first resistor having substantially less resistance than said second resistor and providing the neutralizing signal thereacross, a fixed capacitor connected between the other side of said first resistor and said base electrode for feeding back the neutralizing signal to neutralize the unwanted signal, whereby said first resistor forms a source impedance for the neutralizing signal which is less than the impedance of said neutralizing winding and uniform amplifier operation is obtained with transistors having different values of said interelectrode capacity.

References Cited in the file of this patent

UNITED STATES PATENTS

| | | |
|---|---|---|
| 1,677,090 | Hull | July 10, 1928 |
| 1,930,672 | Ballantine | Oct. 17, 1933 |
| 2,404,809 | O'Brien | July 30, 1946 |
| 2,802,069 | Weber | Aug. 6, 1957 |
| 2,901,558 | Webster | Aug. 25, 1958 |

OTHER REFERENCES

Philco Semiconductor Data Sheet T1693, November 1959, 4 pages.

2,940,051 Korn et al. June 7, 1960